United States Patent
Nishino et al.

(10) Patent No.: US 8,471,566 B2
(45) Date of Patent: Jun. 25, 2013

(54) INTERNAL SHORT CIRCUIT EVALUATION APPARATUS FOR BATTERY

(75) Inventors: Hajime Nishino, Nara (JP); Masato Fujikawa, Osaka (JP); Mikinari Shimada, Osaka (JP)

(73) Assignee: Panasonic Corporation, Osaka (JP)

( * ) Notice: Subject to any disclaimer, the term of this patent is extended or adjusted under 35 U.S.C. 154(b) by 421 days.

(21) Appl. No.: 12/992,011

(22) PCT Filed: Jan. 18, 2010

(86) PCT No.: PCT/JP2010/000231
§ 371 (c)(1),
(2), (4) Date: Nov. 10, 2010

(87) PCT Pub. No.: WO2010/082502
PCT Pub. Date: Jul. 22, 2010

(65) Prior Publication Data
US 2011/0068800 A1      Mar. 24, 2011

(30) Foreign Application Priority Data
Jan. 19, 2009 (JP) ................. 2009-009220

(51) Int. Cl.
*G01R 31/00* (2006.01)
*G01N 27/416* (2006.01)

(52) U.S. Cl.
USPC .......................... 324/500; 324/426

(58) Field of Classification Search
None
See application file for complete search history.

(56) References Cited

U.S. PATENT DOCUMENTS

| 7,336,081 | B2 * | 2/2008 | Kasamatsu et al. ........... 324/426 |
| 8,138,747 | B2 * | 3/2012 | Nishino et al. ................. 324/134 |
| 8,163,409 | B2 * | 4/2012 | Fujikawa et al. ............... 429/61 |
| 8,168,314 | B2 * | 5/2012 | Fujikawa et al. ............... 429/61 |
| 2005/0253591 | A1 | 11/2005 | Kasamatsu et al. |
| 2006/0222933 | A1 | 10/2006 | Fujikawa et al. |
| 2008/0143337 | A1 | 6/2008 | Fujikawa et al. |
| 2008/0186029 | A1 | 8/2008 | Nishino et al. |
| 2009/0286148 | A1 | 11/2009 | Fujikawa et al. |

FOREIGN PATENT DOCUMENTS

| CN | 101242013 A | 8/2008 |
| JP | 11-102729 | 4/1999 |
| JP | 2005-327616 | 11/2005 |
| JP | 2006-313739 | 11/2006 |
| WO | WO 2008/072456 A1 | 6/2008 |

OTHER PUBLICATIONS

Chinese Office Action issued in Chinese Application No. 201080001927.7 mailed Sep. 24, 2012.

* cited by examiner

*Primary Examiner* — Vinh Nguyen
(74) *Attorney, Agent, or Firm* — McDermott Will & Emery LLP (57) ABSTRACT

The present invention relates to an apparatus for evaluating an internal short circuit of a battery. An object of the invention is to provide an apparatus capable of evaluating whether or not an internal short circuit has occurred in an electrode group in consideration of pressure applied to the electrode group. An internal short circuit evaluation apparatus according to one embodiment of the invention includes at least a pressure member capable of operating independently and applying pressure to at least a predetermined position of the surface of the electrode group, and a short-circuiting member that is pressed into the predetermined position. An internal short circuit evaluation apparatus according to another embodiment of the invention includes a pressure member having an integrated short-circuiting member.

11 Claims, 4 Drawing Sheets

INTERNAL SHORT CIRCUIT EVALUATION APPARATUS FOR BATTERY

RELATED APPLICATIONS

This application is the U.S. National Phase under 35 U.S.C. § 371 of International Application No. PCT/JP2010/000231, filed on Jan. 18, 2010, which in turn claims the benefit of Japanese Application No. 2009-009220, filed on Jan. 19, 2009, the disclosures of which Applications are incorporated by reference herein.

TECHNICAL FIELD

The present invention relates to an apparatus for evaluating an internal short circuit of a battery.

BACKGROUND ART

Examples of items for evaluating the safety of batteries such as lithium ion secondary batteries include evaluation of the heat-generating behavior when an internal short circuit has occurred. Examples of tests of such a battery evaluation test include the UL standard for lithium batteries (UL1642), and a guideline from Battery Association of Japan (SBA G1101-1997 Guideline for Safety Evaluation on Secondary Lithium Cells). Such evaluation tests are utilized and the results of the tests are reflected in the development of various batteries. For example, Patent Document 1 discloses that the battery manufacturing process has been improved in order to obtain a high-capacity battery exhibiting excellent high-output characteristics and cycle characteristics and having a high level of safety. In Patent Document 2, it is proposed to set the ratio between the thickness of the heat-resistant porous layer disposed between positive and negative electrodes and the thickness of the side wall of a battery can within a predetermined range, in order to achieve both a high level of safety and high battery characteristics of a lithium secondary battery.

For example, a nail penetration test among the above-described evaluation tests is a test for examining an internal short circuit caused by a nail penetrating through or piercing into a battery from the side face. Due to the nail piercing thereinto, a short circuit portion is generated by the nail between the positive and negative electrodes inside the battery. Consequently, a short circuit current flows through that short circuit portion, thus generating Joule heat. A change in the battery temperature or the battery voltage that is caused by these phenomena is measured in the internal short circuit test.

A crush test is a test for examining an internal short circuit caused by physically deforming a battery using a round bar, a square bar, a flat plate or the like. Specifically, in the crush test, an internal short circuit is caused between the positive and negative electrodes by physical deformation, and a change in the battery temperature or the battery voltage is measured.

Furthermore, other than the nail penetration test and the crush test, a foreign object push-in test in which an electrode group is taken out from a battery, and a foreign object is pushed in from the outside of the electrode group toward the inside is also conducted as the internal short circuit test for a battery.

PRIOR ART DOCUMENT

Patent Document
 Patent Document 1: Japanese Laid-Open Patent Publication No. Hei 11-102729
 Patent Document 2: Japanese Laid-Open Patent Publication No. 2006-313739

DISCLOSURE OF THE INVENTION

Problem to be Solved by the Invention

The pressure applied to an electrode group included in a battery or a battery pack greatly differs depending on the difference of the structure of batteries or battery packs. However, in the case of, for example, using an electrode group that has been taken out from a battery or a battery pack in the nail penetration test as described above or the like, the electrode group that has been taken out is not in a bound state, unlike when the electrode group is in the battery or the battery pack. Furthermore, the electrode group that has been taken out is pierced by a nail or deformed with a fixed force or a foreign object is pushed therein with a fixed force, independent from the structure of the battery or the battery pack. That is, the conventional short circuit tests are not necessarily conducted in consideration of the pressurized force applied to the electrode group.

In view of this, an object of the present invention is to provide an apparatus capable of evaluating whether or not an internal short circuit has occurred in an electrode group (i.e., a battery) in consideration of a pressurized force applied to the electrode group.

Means for Solving the Problem

In one aspect of the present invention, an internal short circuit evaluation apparatus for a battery that includes: an electrode group including a positive electrode, a negative electrode, and a separator disposed therebetween; an electrolyte; and a battery case for housing the electrode group and the electrolyte, has:

(1) a pressure member for applying pressure to at least a predetermined position of the surface of the electrode group;
(2) a short-circuiting member for being pressed into the predetermined position;
(3) a battery information measurement unit for measuring battery information that changes when a short circuit is caused by the short-circuiting member in the electrode group;
(4) a short circuit detection unit for determining occurrence of an internal short circuit by detecting a change in the battery information measured by the battery information measurement unit and comparing the battery information to a predetermined reference value;
(5) a pressurized force measurement unit for measuring a pressurized force applied to the pressure member;
(6) a pressure member control unit for controlling the pressure member based on a signal from the short circuit detection unit and a signal from the pressurized force measurement unit; and
(7) a short-circuiting member control unit for controlling the short-circuiting member based on a signal from the short circuit detection unit and a signal from the pressurized force measurement unit.

In another aspect of the present invention, an internal short circuit evaluation apparatus for a battery that includes: an electrode group including a positive electrode, a negative electrode, and a separator disposed therebetween; an electrolyte; and a battery case for housing the electrode group and the electrolyte, has:

(i) a pressure member including an integrated short-circuiting member for pushing the short-circuiting member into a predetermined position of the surface of the electrode group while applying pressure to at least the predetermined position;

(ii) a battery information measurement unit for measuring battery information that changes when a short circuit is caused by the short-circuiting member in the electrode group;

(iii) a short circuit detection unit for determining occurrence of an internal short circuit by detecting a change in the battery information measured by the battery information measurement unit and comparing the battery information to a predetermined reference value;

(iv) a pressurized force measurement unit for measuring a pressurized force applied to the pressure member; and (v) a pressure member control unit for controlling the pressure member based on a signal from the short circuit detection unit and a signal from the pressurized force measurement unit.

Effect of the Invention

According to the present invention, a pressure according to the difference of the structure of a battery or a battery pack can be applied to an electrode group. Therefore, by using an internal short circuit evaluation apparatus of the present invention, an internal short circuit test for an electrode group taken out from a battery or a battery pack can be conducted while the electrode group is maintained in the same state as the state of being incorporated in the battery or the battery pack. Therefore, the internal short circuit test can be accurately conducted for various batteries or battery packs by using the internal short circuit evaluation apparatus of the present invention.

BEST MODE FOR CARRYING OUT THE INVENTION

Embodiment 1

Below is a description of an internal short circuit evaluation apparatus for a battery including an electrode group, an electrolyte, and a battery case for housing these according to this embodiment. The internal short circuit evaluation apparatus includes:

(1) a pressure member for applying pressure to at least a predetermined position of the surface of the electrode group;

(2) a short-circuiting member for being pressed into the predetermined position;

(3) a battery information measurement unit for measuring battery information that changes when a short circuit is caused by the short-circuiting member in the electrode group;

(4) a short circuit detection unit for determining the occurrence of an internal short circuit by detecting a change in the battery information measured by the battery information measurement unit and comparing the battery information to a predetermined reference value;

(5) a pressurized force measurement unit for measuring a pressurized force applied to the pressure member;

(6) a pressure member control unit for controlling the pressure member based on a signal from the short circuit detection unit and a signal from the pressurized force measurement unit; and (7) a short-circuiting member control unit for controlling the short-circuiting member based on a signal from the short circuit detection unit and a signal from the pressurized force measurement unit.

With the internal short circuit evaluation apparatus of this embodiment, an electrode group taken out by disassembling a battery can be used as-is for evaluation of an internal short circuit without exposing the surfaces of positive and negative electrode plates to be short-circuited during pretreatment for the test. On the other hand, in the conventional evaluation of an internal short circuit of a battery, it is necessary to unfold an electrode group up to the position of a predetermined short circuit point in order to, for example, insert a foreign object up to that short circuit point. Unfolding the electrode group in such a way will arouse concern that an electrode mixture may become detached, an electrolyte may evaporate, or the like. Furthermore, in the case of an electrode group included in a polymer battery, a positive electrode, a negative electrode, and a separator are integrated. For this reason, the electrode group included in the polymer battery cannot be unfolded. Therefore, a polymer battery cannot be even subjected to the conventional internal short circuit evaluation test.

Figure 1:
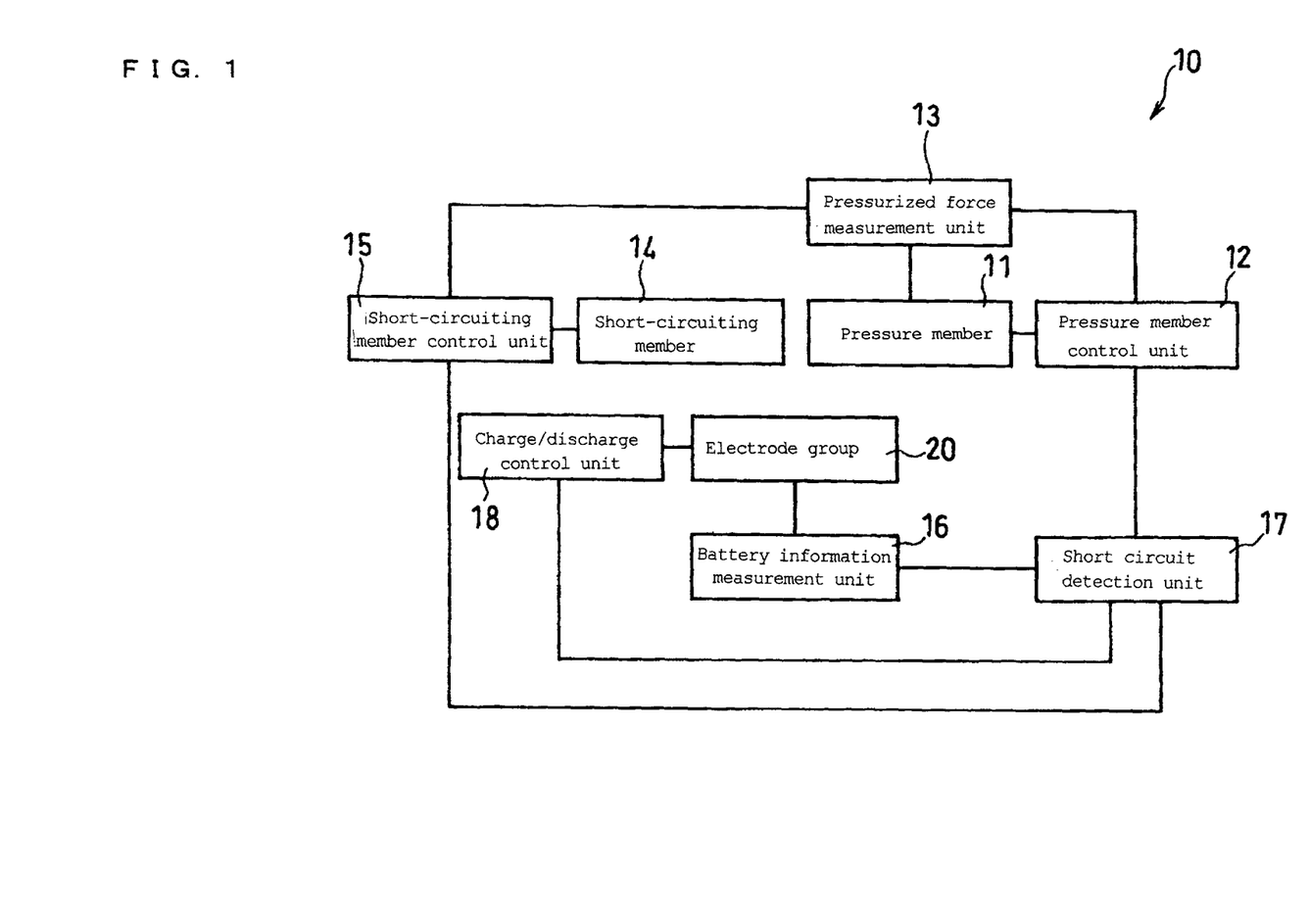
FIG. 1 is a block diagram of an internal short circuit evaluation apparatus according to a preferred embodiment of the present invention.

FIG. 1 shows a block diagram of an internal short circuit evaluation apparatus according to one embodiment of the present invention.

An internal short circuit evaluation apparatus 10 in FIG. 1 includes a pressure member 11, a pressure member control unit 12, a pressurized force measurement unit 13, a short-circuiting member 14, a short-circuiting member control unit 15, a battery information measurement unit 16, a short circuit detection unit 17, and a charge/discharge control unit 18.

Figure 2:
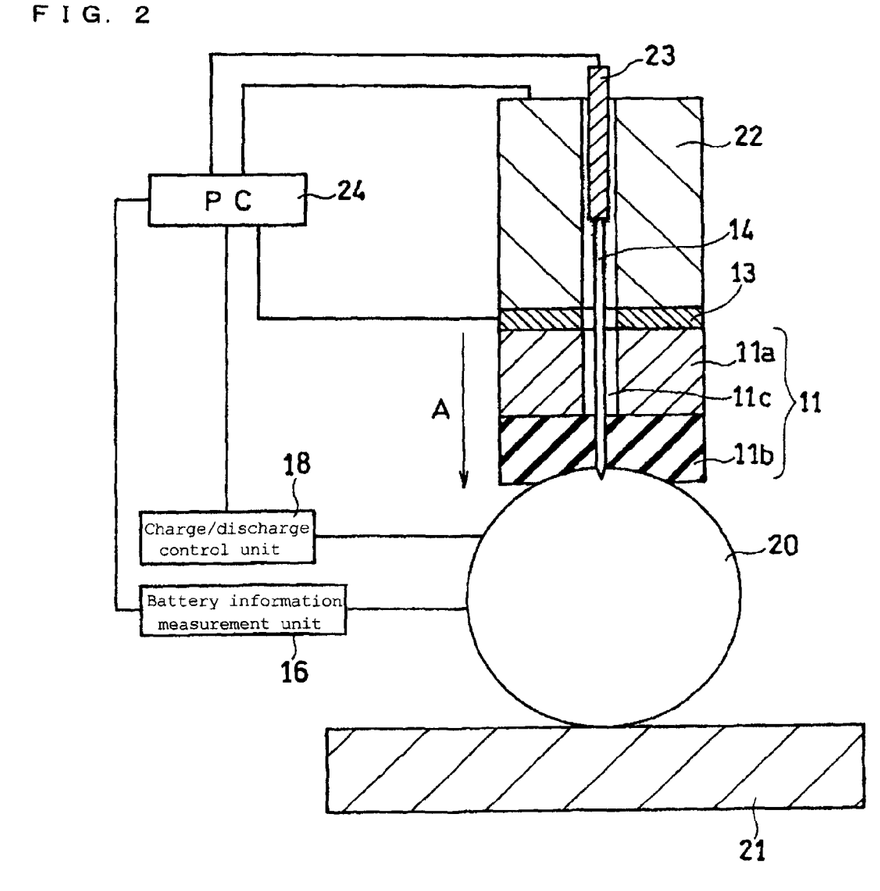
FIG. 2 is a diagram schematically showing an example of the configuration of the internal short circuit evaluation apparatus in FIG. 1.

An example of the configuration of the internal short circuit evaluation apparatus in FIG. 1 will be described with reference to FIG. 2. The internal short circuit evaluation apparatus in FIG. 2 includes a table 21 for placing an electrode group 20 used for an internal short circuit test. The pressure member 11 applies pressure to a predetermined region of the electrode group 20 with a pressure apparatus 22 for the pressure member. The pressure apparatus 22 for the pressure member is supported by a predetermined support (not shown), and the pressure member 11 can apply pressure to the electrode group 20 by, for example, the pressure apparatus 22 for the pressure member moving toward the electrode group 20 (in the direction of arrow A). The pressurized force measurement unit 13 is disposed between the pressure member 11 and the pressure apparatus 22. If the pressure apparatus 22 includes a pressurized force measurement unit, it is not necessary to additionally provide a pressurized force measurement unit. The short-circuiting member 14 is pushed into the electrode group 20 by a pressure apparatus 23 for the short-circuiting member. The pressure apparatus 23 for the short-circuiting member is supported by a predetermined support (not shown), and the short-circuiting member 14 is pushed into the electrode group 20 by, for example, the pressure apparatus 23 for the short-circuiting member moving toward the electrode group 20. A computer (PC) 24 is provided with the pressure member control unit, the short-circuiting member control unit, and the short circuit detection unit. In the internal short circuit evaluation apparatus in FIG. 2, the charge/discharge control unit 18 is connected to the electrode group 20, and the battery information measurement unit 16 for measuring battery information on the electrode group 20 is provided. The charge/discharge control unit 18 is provided with two terminals, and the two terminals are respectively connected to the positive electrode and the negative electrode of the electrode group 20 so as to be able to control charge and discharge of the electrode group 20. Further, the battery information measurement unit 16 and the charge/discharge control unit 18 are connected to the PC 24. In FIG. 2, only the outermost periphery of the face of the electrode group 20 perpendicular to the winding axis is shown.

In the internal short circuit evaluation apparatus 10 of this embodiment, first, a predetermined region including a predetermined position of the electrode group 20 is pressed by the pressure member 11. The pressurized force applied by the pressure member 11 is measured by the pressurized force measurement unit 13. When the pressurized force reaches a predetermined value, the pressure member control unit 12 stops the movement of the pressure member 11 to maintain the pressurized force at the predetermined value.

The electrode group 20 used for an internal short circuit test may be a wound type or a laminated type. In the case of a wound-type electrode group, the wound-type electrode group may be cylindrical or a pillar (wound-type square electrode group) with a substantially elliptical cross section as included in a square battery. With a cylindrical electrode group, the above predetermined position can be a predetermined position on a face parallel to the winding axis, for example. With a laminated-type electrode group, the above predetermined position can be a predetermined position on a face perpendicular to the laminating direction, for example. With a wound-type square electrode group, the above predetermined position can be a predetermined position on the face of the electrode group substantially parallel to the major axis direction of a substantially elliptical transverse cross section of the electrode group perpendicular to the winding axis, for example.

The pressurized force applied to the electrode group 20 need only be 1000 N or less, that is, in the range of 0 to 1000 N, for example, and is adjusted as appropriate according to the structure of the electrode group 20, for instance. For example, the pressurized force applied to the cylindrical electrode group included in a cylindrical battery can be 800 N or less, specifically, 0 to 800 N. The pressurized force applied to the electrode group included in a square battery can be, for example, 400 N or less, specifically, 0 to 400 N.

The cylindrical electrode group is highly pressure-resistant, and can resist a high pressure. On the other hand, the electrode group included in a square battery has slightly lower pressure resistance than that of the cylindrical electrode group. For this reason, the pressurized force applied to the electrode group included in a square battery is set lower than a pressurized force applied to the cylindrical electrode group. Here, the electrode group included in a square battery may be a wound type or a laminated type.

A contact portion of the pressure member 11 to come into contact with the electrode group 20 preferably contains a rubber material, and more preferably is made only of a rubber material. Since the contact portion has rubber elasticity, the contact portion can deform in conformity to the surface shape of the electrode group 20 when applying pressure to the electrode group 20. Accordingly, the pressure member 11 can apply pressure to the electrode group 20 in the state where the pressure member 11 is in close contact with the electrode group 20, that is, in a large contact area.

The rubber material is not particularly limited so long as it has rubber elasticity. Examples of the rubber material include nitrile rubber, styrene-butadiene rubber, natural rubber, ethylene-propylene rubber, chloroprene rubber, silicone rubber, urethane rubber, fluorine rubber, and Hypalon.

The pressure member 11 can include the pressure apparatus 22 for the pressure member as described above, and can apply pressure to a predetermined region including the predetermined position of the electrode group 20 with the pressure apparatus 22. Examples of the type of the pressure apparatus include a screw type using a servomotor, a post guide screw type, a pendulum type, a lever type, a crank type, a mechanical press type, a hydraulic press type, and an air press type.

As the pressurized force measurement unit 13, a pressure sensor can be used, for example.

Next, the short-circuiting member control unit 15 causes the short-circuiting member 14 to be pressed into the predetermined position of the electrode group 20 from the outside of the electrode group 20 toward the inside thereof, based on a signal from the pressurized force measurement unit 13.

FIG. 2 also shows the state where the pressure member 11 applies pressure to the electrode group 20, and the short-circuiting member 14 is pressed into the predetermined position of the electrode group 20. The pressure member 11 shown in FIG. 2 has a base portion 11a and a contact portion 11b provided on the electrode group 20 side of the base portion 11a. The contact portion 11b is made of a rubber material. The pressure member 11 is provided with a through hole 11c, and the short-circuiting member 14 pierces the predetermined position of the electrode group 20 through the through hole 11c.

The material constituting the base portion 11a is not particularly limited so long as a pressurized force of 1000 N or less can be applied to the electrode group 20. Examples of this material include stainless steel.

The shape of the contact portion 11b in a cross section perpendicular to the direction of applying a pressurized force (the direction of arrow A or the thickness direction) is not particularly limited. For example, the shape of the cross section of the contact portion 11b may be circular, elliptical, or rectangular.

It is preferable that the through hole 11c is provided so as to pass along the center axis of the contact portion 11b. If the electrode group 20 is cylindrical, it is preferable that the pressure member 11 is brought into contact with the electrode group 20 such that the through hole 11c extends parallel to the diameter direction perpendicular to the winding axis of the electrode group 20. If the electrode group 20 is a laminated-type or wound-type electrode group included in a square battery, it is preferable that the pressure member 11 is brought into contact with the electrode group 20 such that the through hole 11c extends parallel to the laminating direction of electrode plates. Accordingly, a pressurized force can be uniformly applied to a region including the predetermined position of the electrode group 20. Here, the center axis of the contact portion 11b refers to an axis that passes the central point of the shape of a cross section perpendicular to the thickness direction thereof, and is parallel to the direction of applying a pressurized force.

It is preferable that a portion of the short-circuiting member 14 to come into contact with the electrode group 20 has a sharp projecting shape or a sharp blade edge shape. The short-circuiting member 14 as described above is pushed into the predetermined position of the electrode group 20, whereby the positive and negative electrodes that are in the vicinity of the tip of the pressure member 11 can be reliably short-circuited. At this time, the positive and negative electrodes may be short-circuited by being in direct contact with each other or may be short-circuited via the short-circuiting member 14.

As the material of the short-circuiting member 14, it is possible to use, for example, metals such as iron, nickel, and stainless steel, nonconductors such as insulating ceramics and resins, and high resistance materials such as semiconductors and resins containing a conductive agent. Further, a short-circuiting member obtained by covering a predetermined material (e.g., any of the metals and non conductors) with any of the high resistance materials can also be used.

If the material of the short-circuiting member 14 is metal, the life of the short-circuiting member 14 can be extended. Resistance at the short circuit point can be controlled by using the short-circuiting member 14 made of a high resistance material or the short-circuiting member 14 having the surface portion made of a high resistance material.

As the short-circuiting member 14, it is possible to use, for example, a nail whose portion to come into contact with the electrode group 20 has a sharp projecting shape or a sharp blade edge shape.

It is preferable that the speed at which the short-circuiting member 14 is pushed into the electrode group 20 is 0.1 mm/s to 180 mm/s. It is preferable that the pressurized force applied when pushing the short-circuiting member 14 into the electrode group 20 is 50 N or less. It is possible to effectively cause a short circuit at the predetermined position of the electrode group 20 by pushing the short-circuiting member 14 into the electrode group 20 on such conditions.

The short-circuiting member 14 may include the pressure apparatus 23 for the short-circuiting member as described above. As the pressure apparatus 23 for the short-circuiting member, an apparatus similar to the pressure apparatus for the pressure member can be used.

In the internal short circuit evaluation apparatus 10 of this embodiment, when the short-circuiting member 14 causes a short circuit in the electrode group 20, battery information on the electrode group 20 is measured by the battery information measurement unit 16. The short circuit detection unit 17 receives the battery information measured by the battery information measurement unit 16. When the battery information measured by the battery information measurement unit 16 changes, the short circuit detection unit 17 determines whether or not an internal short circuit has occurred by comparing the changed battery information to a predetermined reference value. If it is determined that an internal short circuit has occurred, the short circuit detection unit 17 transmits a signal to the pressure member control unit 12 and the short-circuiting member control unit 15. The pressure member control unit 12 and the short-circuiting member control unit 15 control the pressure apparatus 22 for the pressure member and the pressure apparatus 23 for the short-circuiting member based on the signal from the short circuit detection unit 17 to return to the pressure member 11 and the short-circuiting member 14 to return to their original positions. In this way, the application of pressure to and the internal short circuit in the electrode group 20 are stopped.

As the short circuit detection unit 17, it is possible to use, for example, a predetermined circuit capable of determining the occurrence of an internal short circuit by detecting a change in the battery information on the electrode group 20, and comparing the changed battery information to a predetermined reference value, and transmitting a signal to the pressure member control unit 12 and the short-circuiting member control unit 15 if it is determined that an internal short circuit has occurred.

Examples of the battery information measured by the battery information measurement unit 16 include a battery voltage and a temperature of the electrode group. Among them, a battery voltage is sensitively dependent on an internal short circuit, and therefore it is preferable to measure a battery voltage as the battery information. For example, a battery voltage may be measured in advance when pushing the short-circuiting member 14 into the electrode group 20, and the short circuit detection unit 17 may determine that an internal short circuit has occurred when the battery voltage falls by a predetermined value or more due to the internal short circuit.

In the case of measuring a battery voltage as the battery information, it is possible to use, for example, a voltmeter as the battery information measurement unit 16. With the internal short circuit evaluation apparatus in FIG. 2, the case where a battery voltage is measured is shown, and the battery information measurement unit 16 is connected to, for example, a positive electrode terminal (not shown) and a negative electrode terminal (not shown) provided for the electrode group 20 such that the battery information measurement unit 16 and the electrode group 20 are connected in parallel.

In the case of measuring the temperature of the electrode group 20 as the battery information, it is possible to use, for example, a thermocouple, a thermoviewer, or the like as the battery information measurement unit 16. Alternatively, the amount of heat generated by a short circuit may be measured as the battery information. In this case, it is possible to use a calorimeter or the like as the battery information measurement unit 16.

The reference value set in the short circuit detection unit 17 is selected as appropriate according to the level of safety required for the battery.

Transmission of a signal from the short circuit detection unit 17 to the pressure member control unit 12 and the short-circuiting member control unit 15 when it is determined that an internal short circuit has occurred may be performed at the time of determining the occurrence of the internal short circuit. The signal may be transmitted after a predetermined delay using a timer or the like.

It is preferable that the internal short circuit evaluation apparatus 10 of this embodiment further includes the charge/discharge control unit 18 for controlling charge and discharge of the electrode group 20 based on a signal from the short circuit detection unit 17, as shown in FIG. 1. A short circuit is caused in the electrode group 20 in the pressure-applied state, and at the same time, a current is input/output to/from the electrode group 20 using the charge/discharge control unit 18, and a change in the battery information at that time is measured. Accordingly, it is possible to conduct, using one electrode group (test cell), a test on the assumption of a parallel-connected battery pack or a test on the assumption of a battery with a larger output or with a smaller output than that of the test cell used.

Each of the various control units described above may include, for example, a receiving unit for receiving a command from a separate constituent element and a transmitting unit capable of transmitting a additional command based on that command.

By using the internal short circuit evaluation apparatus 10 as described above, the short-circuiting member 14 can be pushed into the electrode group 20 in the state where pressure according to the difference of the structure of batteries or battery packs is applied to the electrode group 20. For example, by using the internal short circuit evaluation apparatus 10 of this embodiment, a short circuit between the positive and negative electrodes can be caused under controlled pressure.

Embodiment 2

An internal short circuit evaluation apparatus for a battery including an electrode group, an electrolyte, and a battery case for housing these according to another embodiment will be described. An internal short circuit evaluation apparatus of this embodiment includes:

(i) a pressure member including an integrated short-circuiting member for pushing the short-circuiting member into a predetermined position of the surface of the electrode group while applying pressure to at least the predetermined position;

(ii) a battery information measurement unit for measuring battery information that changes when a short circuit is caused by the short-circuiting member in the electrode group;

(iii) a short circuit detection unit for determining the occurrence of an internal short circuit by detecting a change in the battery information measured by the battery information measurement unit and comparing the battery information to a predetermined reference value;

(iv) a pressurized force measurement unit for measuring a pressurized force applied to the pressure member; and (v) a pressure member control unit for controlling the pressure member based on a signal from the short circuit detection unit and a signal from the pressurized force measurement unit.

Figure 3:
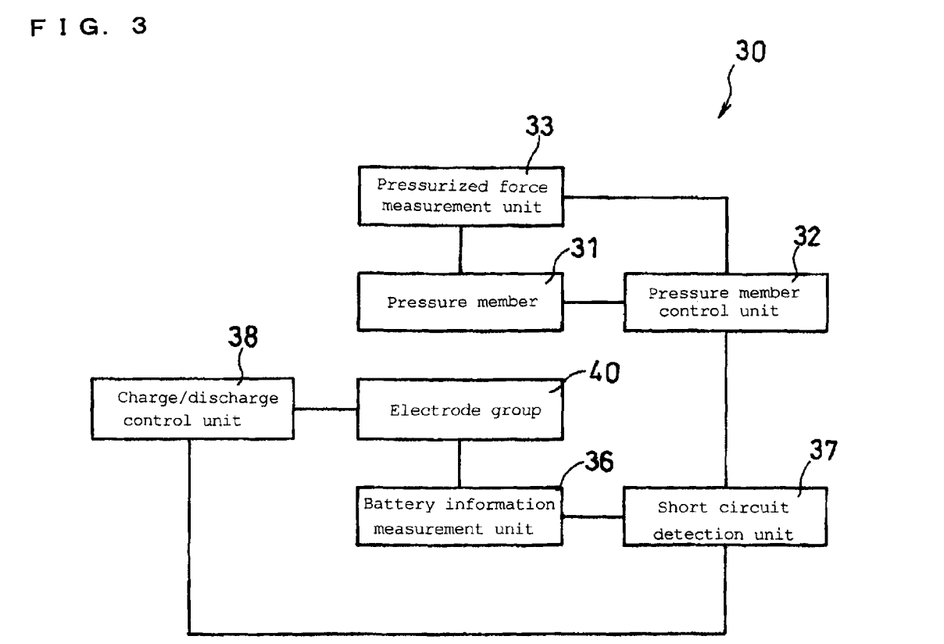
FIG. 3 is a block diagram of an internal short circuit evaluation apparatus according to another preferred embodiment of the present invention.

FIG. 3 shows a block diagram of an example of an internal short circuit evaluation apparatus according to this embodiment.

An internal short circuit evaluation apparatus 30 in FIG. 3 includes a pressure member 31 having an integrated short-circuiting member (not shown), a pressure member control unit 32, a pressurized force measurement unit 33, a battery information measurement unit 36, a short circuit detection unit 37, and a charge/discharge control unit 38.

In the internal short circuit evaluation apparatus 30 in FIG. 3, the pressure member 31 applies pressure to a predetermined region including a predetermined position of an electrode group 40 at a fixed speed until it reaches a predetermined pressure. Specifically, the pressurized force applied by the pressure member 31 is measured by the pressurized force measurement unit 33. The pressure member control unit 32 causes the pressure member 31 to move at a fixed speed until the predetermined position of the electrode group 40 is pressed with the predetermined pressurized force, based on a signal from the pressurized force measurement unit 33. At this time, the predetermined position is pressed by the short-circuiting member, and thereby a short circuit can be caused by the short-circuiting member at that position.

As with the case of Embodiment 1, if the electrode group 40 is cylindrical, it is preferable that the pressure member 31 is brought into contact with the electrode group 40 such that the projecting direction of the short-circuiting member is parallel to a diameter direction perpendicular to the winding axis of the electrode group 40. If the electrode group 40 is a laminated-type or wound-type electrode group included in a square battery, it is preferable that the pressure member 31 is brought into contact with the electrode group 40 such that the projecting direction of the short-circuiting member is parallel to the laminating direction of electrode plates.

In this embodiment as well, the pressurized force applied to the electrode group 40 need only be in the range of 0 to 1000 N as with the case of Embodiment 1. For example, it is preferable that the pressurized force applied to the cylindrical electrode group is in the range of 0 to 800 N. It is preferable that the pressurized force applied to the laminated-type or wound-type electrode group included in a square battery is in the range of 0 to 400 N.

It is preferable that the moving speed of the pressure member 31 is 0.1 to 5 mm/s. It is thought that an internal short circuit is caused by expansion/contraction of a positive electrode and/or a negative electrode due to charge and discharge. For this reason, when an internal short circuit test is implemented, it is desirable to cause a short circuit between positive and negative electrodes at a speed as slow as possible in a possible range.

In this embodiment as well, battery information that changes when a short circuit is caused by the short-circuiting member is measured by the battery information measurement unit 36, as with the case of Embodiment 1. The battery information measured by the battery information measurement unit 36 is transmitted to the short circuit detection unit 37. When the battery information measured by the battery information measurement unit 36 changes, the short circuit detection unit 37 determines whether or not an internal short circuit has occurred by comparing the changed battery information to a predetermined reference value. If it is determined that an internal short circuit has occurred, a signal is transmitted from the short circuit detection unit 37 to the pressure member control unit 32. If the pressure member 31 includes a pressure apparatus, the pressure member control unit 32 controls that pressure apparatus to cause the pressure member 31 to return to the original position based on the signal from the short circuit detection unit 37. In this way, the application of pressure to and the internal short circuit in the electrode group 40 are stopped.

Figure 4:
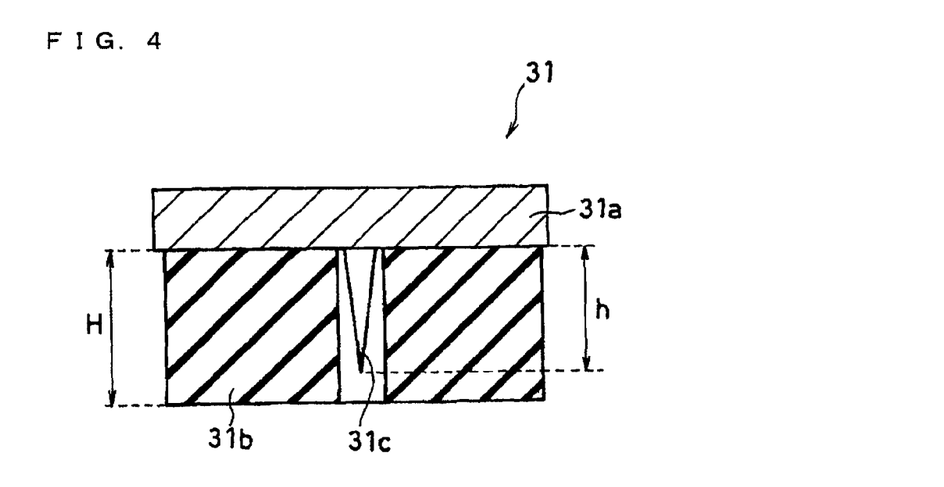
FIG. 4 is a vertical cross-sectional view showing an example of a pressure member that has an integrated short-circuiting member, and is included in the internal short circuit evaluation apparatus in FIG. 3.
Figure 5:
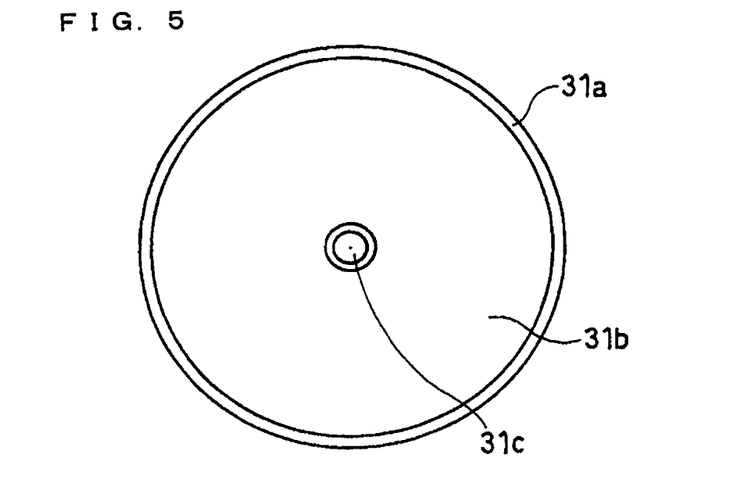
FIG. 5 is a bottom view of the pressure member in FIG. 4.

FIGS. 4 and 5 show an example of the pressure member 31 used in this embodiment. FIG. 4 is a vertical cross-sectional view showing an example of the pressure member, and FIG. 5 is a bottom view of the pressure member in FIG. 4.

The pressure member 31 in FIG. 4 includes a base portion 31a, and a contact portion 31b and a short-circuiting member 31c that are provided on the side of the base portion 31a where the pressure member 31 comes into contact with the electrode group 40. The contact portion 31b preferably contains a rubber material, and more preferably is made only of a rubber material, as with the case of Embodiment 1.

The material of the short-circuiting member 31c may be the same as that of Embodiment 1. Furthermore, a portion of the short-circuiting member 31c to come into contact with the electrode group 40 may have a sharp projecting shape or sharp blade edge shape.

In this embodiment as well, it is possible to use, for example, a nail whose portion to come into contact with the electrode group 40 has a sharp projecting shape or a sharp blade edge shape, as the short-circuiting member 31c.

The material constituting the base portion 31a is not particularly limited so long as the pressure member 31 can apply a pressurized force of 0 to 1000 N to the electrode group 40. For example, stainless steel can be used as that material.

In the pressure member 31, the arrangement of the contact portion 31b containing a rubber material and the short-circuiting member 31c is not particularly limited. As shown in FIG. 5, the pressure member may include, for example, the contact portion 31b having a toroidal cross section, and the short-circuiting member 31c disposed in the central portion (cavity portion) of the contact portion 31b. Alternatively, the pressure member may include two contact portions and a short-circuiting member disposed therebetween. Alternatively, the pressure member may include a short-circuiting member, and three or more contact portions aligned at equal intervals on a circle having its center at the point on the base portion at which the short-circuiting member is disposed.

The modulus of elasticity of the rubber material contained in the contact portion 31b and the ratio of a height H of the contact portion 31b to a height h of the short-circuiting member 31c are selected as appropriate according to the pressurized force applied to the electrode group 40.

For example, if the pressurized force applied to the electrode group 40 is set high, the ratio of the height H of the contact portion 31b to the height h of the short-circuiting member 31c (H/h) is set high. If the pressurized force applied to the electrode group 40 is low, the ratio (H/h) is set lower than the case where the pressurized force applied to the electrode group 40 is higher.

Specifically, it is preferable that the modulus of elasticity of the rubber material contained in the contact portion 31b is 0.1 to 10 GPa. It is preferable that the range of the ratio (H/h) is from 1 to 20.

The pressure member 31 may include a pressure apparatus as with the case of Embodiment 1. The pressurized force and the moving speed of the pressure member can be controlled by the pressure member control unit 32 controlling the pressure apparatus.

In this embodiment as well, it is preferable that the internal short circuit evaluation apparatus 30 further includes the charge/discharge control unit 38. The reason for this is the same as described above.

The same units as in Embodiment 1 can be used for the pressurized force measurement unit 33, the battery information measurement unit 36, the short circuit detection unit 37, and the various control units. In this embodiment, the pressure member control unit and the short circuit detection unit may be provided in one PC.

In this embodiment as well, examples of the battery information measured by the battery information measurement unit 36 include a battery voltage and a temperature of the electrode group. Among them, a battery voltage is sensitively dependent on an internal short circuit, and therefore it is preferable to measure a battery voltage as the battery information.

The reference value set in the short circuit detection unit 37 is selected as appropriate according to the level of safety required for the battery.

Furthermore, as with the case of Embodiment 1, transmission of a signal from the short circuit detection unit 37 to the pressure member control unit 32 when it is determined that an internal short circuit has occurred may be performed at the time of determining the occurrence of the internal short circuit, or the signal may be transmitted after a predetermined delay using a timer or the like.

The internal short circuit evaluation apparatus 30 of this embodiment includes the pressure member 31 having the integrated short-circuiting member. Therefore, by using the internal short circuit evaluation apparatus 30 of this embodiment, a foreign object push-in test in which a foreign object is pushed into the electrode group 40 can be conducted while applying pressure to the electrode group 40 at a fixed speed up to a predetermined pressurized force, for example.

Furthermore, with the internal short circuit evaluation apparatus 10 of Embodiment 1, it is necessary to provide, for example, two pressure apparatuses for the pressure member and for the short-circuiting member in order to cause the pressure member 11 to apply pressure and the short-circuiting member 14 to apply pressure. On the other hand, with the internal short circuit evaluation apparatus 30 of this embodiment, by adjusting the H/h ratio, one pressure apparatus can cause the pressure member 31 to apply pressure, and can control a pressurized force applied to the electrode group 40 when causing a short circuit. Therefore, the internal short circuit evaluation apparatus 30 of this embodiment can be simplified compared to the internal short circuit evaluation apparatus 10 of Embodiment 1.

It is preferable that each of the internal short circuit evaluation apparatuses of Embodiments 1 and 2 above has a thermostatic chamber for housing at least an electrode group to be evaluated, the pressure member, and the short-circuiting member. Specifically, it is preferable that the internal short circuit evaluation apparatus 10 of Embodiment 1 includes a thermostatic chamber for housing at least an electrode group to be evaluated, the pressure member, and the short-circuiting member. It is preferable that the internal short circuit evaluation apparatus 30 of Embodiment 2 includes a thermostatic chamber for housing at least an electrode group to be evaluated and the pressure member including the short-circuiting member.

The safety of a battery depends on the Joule heat at a short circuit point. The Joule heat depends on the output of a battery, and the output depends on the battery temperature. That is, the battery temperature affects the result of an internal short circuit test. Therefore, internal short circuit evaluation of a battery can be performed more accurately by providing a thermostatic chamber for housing at least an electrode group, the pressure member, and the short-circuiting member.

The type of a battery that is evaluated using the internal short circuit evaluation apparatus of the present invention is not particularly limited. Using the internal short circuit evaluation apparatus of the present invention, it is possible to evaluate a battery that includes: for example, an electrode group including a positive electrode, a negative electrode, and a separator disposed therebetween; an electrolyte; and a battery case for housing the electrode group; and the electrolyte. Examples of such a battery include primary batteries such as manganese dry batteries, alkaline dry batteries, and lithium primary batteries, and secondary batteries such as lead-acid batteries, nickel-cadmium storage batteries, nickel-metal hydride batteries, and lithium secondary batteries. Further, the battery case may be a metal case or a case made of a laminate film, for example.

It is possible to use a method for producing a battery whose safety level has been specified by the internal short circuit evaluation apparatus of the present invention to produce a battery or a battery pack having the same safety level as the specified level. Specifically, a battery is produced using a predetermined production method, and the obtained battery is evaluated using the internal short circuit evaluation apparatus of the present invention. If this battery is determined to have a desired safety level, the production method used for the battery can be used to produce a battery having the same safety level or a battery pack including that battery.

As described above, by using the same production method as that used for a battery whose safety level has been specified, it is possible to ensure the safety level of a battery or a battery pack against an internal short circuit.

Furthermore, with the present invention, it is possible to specify the safety level of a battery, thereby enabling, with ease, the selection of the optimum use for that battery and the designing of an application device using that battery, for instance.

Hereinafter, the present invention will be described in detail with reference to Examples.

EXAMPLES

<<Production of Battery A>>

A polymer battery (non-aqueous electrolyte secondary battery) was produced as follows.

(Production of Positive Electrode)

Lithium cobaltate was used as the positive electrode active material. A positive electrode mixture paste was prepared by mixing 85 parts by weight of the positive electrode active material, 5 parts by weight of polyvinylidene fluoride (PVDF) as the binder, 10 parts by weight of acetylene black as the conductive agent, and a proper amount of N-methyl-2-pyrrolidone (NMP).

The obtained positive electrode mixture paste was applied to both sides of a positive electrode current collector made of aluminum (thickness: 15 µm), dried, and rolled to obtain a positive electrode having a thickness of 160 µm.

(Production of Negative Electrode)

Artificial graphite was used as the negative electrode active material. A negative electrode mixture paste was prepared by mixing 95 parts by weight of the negative electrode active material, 5 parts by weight of PVDF as the binder, and a proper amount of NMP.

The obtained negative electrode mixture paste was applied to both sides of a negative electrode current collector made of copper (thickness: 10 µm), dried, and rolled to obtain a negative electrode having a thickness of 165 µm.

(Production of Separator)

A paste was obtained by mixing 100 parts by weight of a copolymer of vinylidene fluoride and hexafluoropropylene (P(VDF-HFP)), 100 parts by weight of dibutyl phthalate (DBP), a predetermined amount of N-methyl-2-pyrrolidone (NMP). The obtained paste was formed into a film, and NMP was evaporated. Next, the obtained film was immersed in diethyl ether to extract DBP, thereby obtaining a microporous film made of P(VDF-HFP). The obtained microporous film was used as the separator.

(Assembly of Battery)

The positive electrode, the separator, and the negative electrode that were obtained as described above were thermally fused to obtain a laminated-type electrode group. An end of a positive electrode lead made of aluminum is connected to the positive electrode current collector, and an end of a negative electrode lead made of copper was connected to the negative electrode current collector.

A pouched battery case made of an aluminum laminate film was prepared. This laminate film is formed by a film made of Al foil, a film made of polypropylene arranged on the inside of the Al foil, and a film made of polyethylene terephthalate and nylon arranged on the outside of the Al foil.

The electrode group was housed inside the battery case. The other end of the positive electrode lead and the other end of the negative electrode lead were pulled out from the opening of the battery case to the outside.

Next, a non-aqueous electrolyte was injected into the battery case to impregnate the electrode group with the non-aqueous electrolyte. This caused the separator to hold the non-aqueous electrolyte. The non-aqueous electrolyte was prepared by dissolving lithium hexafluorophosphate ($LiPF_6$) in a concentration of 1.0 mol/L in a non-aqueous solvent containing ethylene carbonate and ethylmethyl carbonate at a volume ratio of 1:3.

Then, while ensuring the electrical insulation between the positive and negative electrode leads and the airtightness of the battery case, the opening of the battery case was sealed to obtain a polymer battery. The obtained battery was used as a battery A.

<<Production of Battery B>>

A wound-type non-aqueous electrolyte secondary battery in which the amount of binder contained in electrodes is less than normal was produced as follows.

(Production of Positive Electrode)

Lithium cobaltate was used as the positive electrode active material. A positive electrode mixture paste was prepared by mixing 88 parts by weight of the positive electrode active material, 2 parts by weight of PVDF as the binder, 10 parts by weight of acetylene black as the conductive agent, and a proper amount of NMP.

The obtained positive electrode mixture paste was applied to both sides of a positive electrode current collector made of aluminum (thickness: 15 µm), dried, and rolled to obtain a positive electrode having a thickness of 156 µm.

(Production of Negative Electrode)

Artificial graphite was used as the negative electrode active material. A negative electrode mixture paste was prepared by mixing 98 parts by weight of the negative electrode active material, 2 parts by weight of PVDF as the binder, and a proper amount of NMP.

The obtained negative electrode mixture paste was applied to both sides of a negative electrode current collector made of copper (thickness: 10 µm), dried, and rolled to obtain a negative electrode having a thickness of 161 µm.

(Assembly of Battery)

The positive electrode, a separator made of polyethylene, and the negative electrode were laminated. The obtained laminate was wound in a spiral to obtain a cylindrical electrode group.

The obtained electrode group was housed in a cylindrical battery case made of nickel-plated iron. One end of a positive electrode lead made of aluminum was connected to the positive electrode current collector, and the other end of the positive electrode lead was connected to a sealing plate. One end of a negative electrode lead made of copper was connected to the negative electrode current collector, and the other end of the negative electrode lead was connected to the inner bottom face of the battery case.

Then, a non-aqueous electrolyte was injected into the battery case. The same non-aqueous electrolyte as in Example 1 was used for the non-aqueous electrolyte.

Next, the opening of the battery case was sealed by the sealing plate to obtain a non-aqueous electrolyte secondary battery. The obtained battery was used as a battery B.

<<Production of Battery C>>

A wound-type non-aqueous electrolyte secondary battery in which the thickness of active material layers is thicker than normal was produced as follows.

(Production of Positive Electrode)

Lithium cobaltate was used as the positive electrode active material. A positive electrode mixture paste was prepared by mixing 85 parts by weight of the positive electrode active material, 5 parts by weight of PVDF as the binder, 10 parts by weight of acetylene black as the conductive agent, and a proper amount of NMP.

The obtained positive electrode mixture paste was applied to both sides of a positive electrode current collector made of aluminum (thickness: 15 µm), dried, and rolled to obtain a positive electrode having a thickness of 200 µm.

(Production of Negative Electrode)

Artificial graphite was used as the negative electrode active material. A negative electrode mixture paste was prepared by mixing 95 parts by weight of the negative electrode active material, 5 parts by weight of PVDF as the binder, and a proper amount of NMP.

The obtained negative electrode mixture paste was applied to both sides of a negative electrode current collector made of copper (thickness: 10 μm), dried, and rolled to obtain a negative electrode having a thickness of 208 μm.

(Assembly of Battery)

The positive electrode, a separator made of polyethylene, and the negative electrode were laminated. The obtained laminate was wound in a spiral to obtain a cylindrical electrode group.

The obtained electrode group was housed in a cylindrical battery case made of nickel-plated iron. One end of a positive electrode lead made of aluminum was connected to the positive electrode current collector, and the other end of the positive electrode lead was connected to a sealing plate. One end of a negative electrode lead made of copper was connected to the negative electrode current collector, and the other end of the negative electrode lead was connected to the inner bottom face of the battery case.

Then, a non-aqueous electrolyte was injected into the battery case. The same non-aqueous electrolyte as in Example 1 was used for the non-aqueous electrolyte.

Next, the opening of the battery case was sealed by the sealing plate to obtain a non-aqueous electrolyte secondary battery. The obtained battery was used as a battery C.

<<Production of Battery D>>

Below, an ordinary wound-type non-aqueous electrolyte secondary battery was produced.

(Production of Positive Electrode)

Lithium cobaltate was used as the positive electrode active material. A positive electrode mixture paste was prepared by mixing 85 parts by weight of the positive electrode active material, 5 parts by weight of PVDF as the binder, 10 parts by weight of acetylene black as the conductive agent, and a proper amount of NMP.

The obtained positive electrode mixture paste was applied to both sides of a positive electrode current collector made of aluminum (thickness: 15 μm), dried, and rolled to obtain a positive electrode having a thickness of 160 μm.

(Production of Negative Electrode)

Artificial graphite was used as the negative electrode active material. A negative electrode mixture paste was prepared by mixing 95 parts by weight of the negative electrode active material, 5 parts by weight of PVDF as the binder, and a proper amount of NMP.

The obtained negative electrode mixture paste was applied to both sides of a negative electrode current collector made of copper (thickness: 10 μm), dried, and rolled to obtain a negative electrode having a thickness of 165 μm.

(Assembly of Battery)

The positive electrode, a separator made of polyethylene, and the negative electrode were laminated. The obtained laminate was wound in a spiral to obtain a cylindrical electrode group.

The obtained electrode group was housed in a cylindrical battery case made of nickel-plated iron. One end of a positive electrode lead made of aluminum was connected to the positive electrode current collector, and the other end of the positive electrode lead was connected to a sealing plate. One end of a negative electrode lead made of copper was connected to the negative electrode current collector, and the other end of the negative electrode lead was connected to the inner bottom face of the battery case.

Then, a non-aqueous electrolyte was injected into the battery case. The same non-aqueous electrolyte as in Example 1 was used for the non-aqueous electrolyte.

Next, the opening of the battery case was sealed by the sealing plate to obtain a non-aqueous electrolyte secondary battery. The obtained battery was used as a battery D.

The design capacity of each of the batteries A to D was 2400 mAh.

[Evaluation]

The batteries A to D were subjected to break-in charge/discharge twice. Then, these batteries were charged with a current of 400 mA until the battery voltage reached 4.1 V, and the charged batteries were stored for seven days in a 45° C. environment.

Then, the stored batteries A to D were discharged, and subsequently charged on the following conditions.

Constant current charge: current value 1500 mA/end-of-charge voltage 4.45 V

Constant voltage charge: charge voltage 4.45 V/end-of-charge current 100 mA

Electrode groups A to D were respectively taken out from the charged batteries A to D, and internal short circuit evaluation was performed on these electrode groups A to D using the following evaluation apparatus.

Example 1

In this example, an internal short circuit evaluation apparatus as shown in the block diagram in FIG. 1 was used. Further, a pressure member and a short-circuiting member as shown in FIG. 2 were used. Specifically, a pressure member having the base portion made of SUS304 and the contact portion made of nitrile rubber was used. The contact portion was a cylinder having a diameter of 10 mm and a height of 50 mm.

As the short-circuiting member, a nail having a diameter of 1.0 mm and processed such that the contact portion to come into contact with the electrode group has a sharp projecting shape was used.

A through hole for communication was provided in the base portion and the contact portion constituting the pressure member, thus allowing the short-circuiting member to press the predetermined position of the electrode group through the through hole. The through hole was provided so as to pass along the center axis of the contact portion.

As for the laminated-type electrode group A, the pressure member was brought into contact with the electrode group A such that the contact portion was in contact with a predetermined region including a predetermined position on a face perpendicular to the laminating direction of the electrode plates. At this time, the electrode group A and the pressure member were brought into contact with each other such that the laminating direction of the electrode plates was parallel to the center axis of the above contact portion.

As for the wound-type electrode groups B to D, the pressure member was brought into contact with the electrode group such that the contact portion was in contact with a predetermined region including a predetermined position on the surface parallel to the winding axis of the electrode group. At this time, the electrode group and the pressure member were brought into contact with each other such that the winding axis of the electrode group and the center axis of that contact portion were orthogonal to each other.

The pressurized force when applying pressure to the electrode groups A to D was 50 N, 400 N, and 800 N. The moving speed of the short-circuiting member was 0.1 mm/s, and the pressurized force of the short-circuiting member was 50 N at the maximum.

The battery voltage of each of the electrode groups was measured as the battery information. It was determined that an internal short circuit had occurred if the battery voltage fell by 50 mV or more when the short-circuiting member was pushed into the electrode group.

Evaluation was performed for two on each of the electrode groups A to D. Table 1 shows the results.

Example 2

In this example, an internal short circuit evaluation apparatus as shown in the block diagram in FIG. 3 was used. The vertical cross-sectional view and the bottom view of a pressure member that was used are respectively shown in FIGS. 4 and 5.

Specifically, the pressure member had the base portion made of SUS304 and the contact portion made of nitrile rubber (modulus of elasticity: 0.1 to 10 GPa). Furthermore, a cylindrical cavity portion having a diameter of 2 mm was provided in that contact portion along the center axis.

As a short-circuiting member, a nail having a diameter of 1.0 mm and processed such that the contact portion to come into contact with the electrode group had a sharp projecting shape was used.

The ratio (H/h) of the height of the contact portion H to the height h of the short-circuiting member was 10/2.

With regard to the laminated-type electrode group A, the pressure member was brought into contact with the electrode group A such that the contact portion was in contact with a predetermined region including a predetermined position on a face perpendicular to the laminating direction of the electrode plates. At this time, the electrode group A and the pressure member were brought into contact with each other such that the laminating direction of the electrode plates and the projecting direction of the short-circuiting member were parallel to each other.

With regard to the wound-type electrode groups B to D, the pressure member was brought into contact with the electrode group such that the contact portion was in contact with a predetermined region including a predetermined position on the surface parallel to the winding axis of the electrode group. At this time, the electrode group and the pressure member were brought into contact with each other such that the winding axis of the electrode group and the projecting direction of the short-circuiting member were orthogonal to each other.

The short-circuiting member with which the pressure member was provided was pressed into the predetermined position of the electrode groups A to D at the speed of 0.1 mm/s with the upper limit of the pressurized force applied to the electrode groups A to D set to 1000 N.

The battery voltage of each of the electrode groups was measured as the battery information, as with the case of Example 1. It was determined that an internal short circuit had occurred if the battery voltage fell by 50 mV or more when the short-circuiting member was pushed into the electrode group, and the application of pressure was stopped.

Evaluation was performed for three on each of the electrode groups A to D. Table 1 shows the results.

In Table 1, ○ indicates an electrode group in which an internal short circuit was detected, Δ indicates an electrode group in which an internal short circuit was not observed, and × indicates an electrode group in which a rapid increase in the temperature of the electrode group was observed.

TABLE 1

|  | Example 1 | | | Example 2 |
| --- | --- | --- | --- | --- |
|  | 50N | 400N | 800N |  |
| Battery A (Electrode group A) | ○○ | ○○ | ×× | ○○○ |
| Battery B (Electrode group B) | ○○ | ○○ | ×× | ○○○ |
| Battery C (Electrode group C) | ○○ | ○○ | ×× | ○○Δ |
| Battery D (Electrode group D) | ○○ | ○○ | ×× | ○○○ |

In the conventional internal short circuit test, it is necessary to insert a foreign object up to a short circuit point. However, in the case of a polymer battery (battery A), the electrode plates and the separator are bonded to each other, and thus it is not even possible to conduct an internal short circuit test. Further, in the case of a battery in which the active materials easily become detached due to a small amount of the binder (battery B), it is also difficult to implement the conventional internal short circuit test. Furthermore, in the conventional internal short circuit test, the pressurized force applied to the electrode plates when causing a short circuit cannot be controlled, and thus a short circuit is not easily caused particularly in a battery that is designed to include a mixture having a large thickness (battery C), and pressure when a short circuit is caused therein varies. As a result, even if an internal short circuit test is conducted with the same pressure, a battery may be ignited or may not be ignited.

On the other hand, in the case of using the internal short circuit evaluation apparatus of the present invention, stable test results can be obtained for batteries having any designs, as shown in Table 1.

INDUSTRIAL APPLICABILITY

According to the present invention, evaluation of the internal short circuit in electrode groups taken out from various batteries or various battery packs can be performed in the same state as the state where the electrode groups are incorporated in the batteries or the battery packs. Therefore, an internal short circuit test can be conducted accurately on various batteries or battery packs by using an internal short circuit evaluation apparatus of the present invention.

| Description of Reference Numerals | |
| --- | --- |
| 10 | Internal short circuit evaluation apparatus |
| 11 | Pressure member |
| 11a | Base portion |
| 11b | Contact portion |
| 11c | Through hole |
| 12, 32 | Pressure member control unit |
| 13, 33 | Pressurized force measurement unit |
| 14 | Short-circuiting member |
| 15 | Short-circuiting member control unit |
| 16, 36 | Battery information measurement unit |
| 17, 37 | Short circuit detection unit |
| 18, 38 | Charge/discharge control unit |
| 20, 40 | Electrode group |
| 21 | Table |
| 22 | Pressure apparatus for pressure member |
| 23 | Pressure apparatus for short-circuiting member |
| 24 | Computer |
| 31 | Pressure member having integrated short-circuiting member |

-continued

| | Description of Reference Numerals |
|---|---|
| 31a | Base portion |
| 31b | Contact portion |
| 31c | Short-circuiting member |

The invention claimed is:

1. An internal short circuit evaluation apparatus for a battery, comprising: an electrode group including a positive electrode, a negative electrode, and a separator disposed between said positive electrode and said negative electrode; an electrolyte; and a battery case for housing said electrode group and said electrolyte, said apparatus comprising:
   (1) a pressure member for applying pressure to at least a predetermined position of the surface of said electrode group;
   (2) a short-circuiting member for being pressed into said predetermined position;
   (3) a battery information measurement unit for measuring battery information that changes when a short circuit is caused by said short-circuiting member in said electrode group;
   (4) a short circuit detection unit for determining occurrence of an internal short circuit by detecting a change in said battery information measured by said battery information measurement unit and comparing said battery information to a predetermined reference value;
   (5) a pressurized force measurement unit for measuring a pressurized force applied to said pressure member;
   (6) a pressure member control unit for controlling said pressure member based on a signal from said short circuit detection unit and a signal from said pressurized force measurement unit; and
   (7) a short-circuiting member control unit for controlling said short-circuiting member based on a signal from said short circuit detection unit and a signal from said pressurized force measurement unit.

2. The internal short circuit evaluation apparatus in accordance with claim 1, wherein said pressure member has a through hole, and said short-circuiting member is pressed into said predetermined position through said through hole.

3. The internal short circuit evaluation apparatus in accordance with claim 1, wherein a contact portion of said pressure member to come into contact with said electrode group comprises a rubber material.

4. The internal short circuit evaluation apparatus in accordance with claim 1, wherein a portion of said short-circuiting member to come into contact with said electrode group has a sharp projecting shape or a sharp blade edge shape.

5. An internal short circuit evaluation apparatus for a battery, comprising: an electrode group including a positive electrode, a negative electrode, and a separator disposed between said positive electrode and said negative electrode; an electrolyte; and a battery case for housing said electrode group and said electrolyte, said apparatus comprising:
   (i) a pressure member comprising an integrated short-circuiting member for pushing said short-circuiting member into a predetermined position in a predetermined region of the surface of said electrode group while applying pressure to said predetermined region;
   (ii) a battery information measurement unit for measuring battery information that changes when a short circuit is caused by said short-circuiting member in said electrode group;
   (iii) a short circuit detection unit for determining occurrence of an internal short circuit by detecting a change in said battery information measured by said battery information measurement unit and comparing said battery information to a predetermined reference value;
   (iv) a pressurized force measurement unit for measuring a pressurized force applied to said pressure member; and
   (v) a pressure member control unit for controlling said pressure member based on a signal from said short circuit detection unit and a signal from said pressurized force measurement unit.

6. The internal short circuit evaluation apparatus in accordance with claim 5, wherein a contact portion of said pressure member to come into contact with said electrode group comprises a rubber material.

7. The internal short circuit evaluation apparatus in accordance with claim 5, wherein a portion of said short-circuiting member to come into contact with said electrode group has a sharp projecting shape or a sharp blade edge shape.

8. The internal short circuit evaluation apparatus in accordance with claim 1, further comprising a charge/discharge control unit for controlling charge and discharge of said electrode group based on a signal from said short circuit detection unit.

9. The internal short circuit evaluation apparatus in accordance with claim 1, further comprising a thermostatic chamber for housing at least said electrode group, said pressure member, and said short-circuiting member.

10. The internal short circuit evaluation apparatus in accordance with claim 5, further comprising a charge/discharge control unit for controlling charge and discharge of said electrode group based on a signal from said short circuit detection unit.

11. The internal short circuit evaluation apparatus in accordance with claim 5, further comprising a thermostatic chamber for housing at least said electrode group, said pressure member, and said short-circuiting member.

* * * * *